United States Patent [19]
Tregilgas et al.

[11] Patent Number: 5,259,900
[45] Date of Patent: Nov. 9, 1993

[54] REFLUX ANNEALING DEVICE AND METHOD

[75] Inventors: John H. Tregilgas, Richardson; Walter L. Kriss; Donald F. Weirauch, both of Dallas, all of Tex.

[73] Assignee: Texas Instruments Incorporated, Dallas, Tex.

[21] Appl. No.: 544,087

[22] Filed: Jun. 26, 1990

Related U.S. Application Data

[63] Continuation of Ser. No. 57,705, Jun. 1, 1987, abandoned, which is a continuation of Ser. No. 803,200, Nov. 26, 1985, abandoned.

[51] Int. Cl.$^5$ .................................. C30B 9/02
[52] U.S. Cl. .................................. 156/601; 156/603; 156/621; 156/624; 156/DIG. 72; 156/DIG. 73; 156/DIG. 82; 156/DIG. 89
[58] Field of Search .............. 156/601, 603, 621, 624, 156/DIG. 72, DIG. 73, DIG. 82, DIG. 89, DIG. 90, DIG. 92

[56] References Cited

U.S. PATENT DOCUMENTS

| | | | |
|---|---|---|---|
| 3,619,283 | 11/1971 | Carpenter et al. | 156/DIG. 72 |
| 4,315,477 | 2/1982 | Wang et al. | 156/624 |
| 4,317,689 | 3/1982 | Bowers et al. | 118/415 |
| 4,401,487 | 8/1983 | Lockwood | 156/624 |
| 4,462,959 | 7/1984 | Tregilgas | 156/DIG. 72 |
| 4,474,640 | 10/1984 | War | 156/DIG. 72 |
| 4,504,334 | 3/1985 | Schaake et al. | 156/DIG. 72 |
| 4,507,160 | 3/1985 | Beck et al. | 156/DIG. 72 |
| 4,536,227 | 8/1985 | Brice et al. | 148/13.1 |
| 4,567,849 | 2/1986 | War | 422/258 |

OTHER PUBLICATIONS

Braun et al., "Diffusion of Gold and Mercury Self-Diffussion in N-Type Bridgman-Growth HgTeCd", J. Vac. Sci. Technol. A1(3), Jul.-Sep. 1983, pp. 1641-1644.

Primary Examiner—Robert Kunemund
Attorney, Agent, or Firm—Richard A. Stolz; James C. Kesterson; Richard L. Donaldson

[57] ABSTRACT

Methods of annealing $Hg_{1-x}Cd_xTe$ slices (56) in a mercury reflux chamber (32, 34) with a mercury reservoir (52) at the bottom and condensation regions at the top (62) is disclosed. The chamber is heated by a furnace (44) that creates an annealing region encompassing both the reservoir and a holder (46) for the $Hg_{1-x}Cd_xTe$ slices (56). In preferred embodiment methods reservoir (52) is heated to 270° C. for two hours to sixty days. An annealing immediately after LPE growth by use of either mercury vapor from the melt or a separate reservoir is also disclosed.

15 Claims, 2 Drawing Sheets

REFLUX ANNEALING DEVICE AND METHOD

This application is a continuation of application Ser. No. 057,705, filed Jun. 1, 1987, now abandoned, which is a continuation of application Ser. No. 803,200, filed Nov. 26, 1985, now abandonded.

BACKGROUND OF THE INVENTION

The present invention relates to semiconductor materials, and, more particularly, to the annealing of mercury cadmium telluride ($Hg_{1-x}Cd_xTe$) and related materials.

Alloys of mercury telluride and cadmium telluride, generically denoted $Hg_{1-x}Cd_xTe$, are extensively employed as photosensitive semiconductors for infrared radiation detection. Indeed, $Hg_{.8}Cd_{.2}Te$ has a bandgap of about 0.1 eV which corresponds responds to a photon wavelength of 12 $\mu$m and $Hg_{.73}Cd_{.27}Te$ a bandgap of about 0.24 eV corresponding to a photon wavelength of 5 $\mu$m; these two wavelengths are in the two atmospheric windows of greatest interest for infrared detectors. In particular, p-n junction $Hg_{1-x}Cd_xTe$ photodiode arrays have long been used (see, for example, Lorenze, U.S. Pat. No. 4,286,278), and extrinsic p-type $Hg_{1-x}Cd_xTe$ has potential application in infrared focal plane MIS detector arrays operating in the 10-12 $\mu$m wavelength window. (Note that intrinsic p-type $Hg_{1-x}Cd_xTe$, whose doping is presumably dominated by mercury vacancies, was recently found to have midgap recombination centers proportional in concentration to the shallow acceptors; see C. Jones et al., 3 J. Vac. Sci. Tech. A 131 (1985). And these recombination centers shorten minority carrier lifetimes and are sources of recombination-generation noise; thus extrinsic p-type $Hg_{1-x}Cd_xTe$ is preferred to intrinsic p-type.) And these detectors are fabricated in large area $Hg_{1-x}Cd_xTe$ that may be grown by LPE. MOCVD, MBE or bulk techniques.

The usual manufacture of bulk $Hg_{1-x}Cd_xTe$ includes recrystallization and homogenization at a high temperature (650° C.) followed by a low temperature (50°-300° C.) anneal in mercury vapor for extended times to reduce the concentration of metal vacancies; this processing yields an n-type skin free of excess tellurium and a p-type core of condensed metal vacancies and precipitated tellurium. Similarly, $Hg_{1-x}Cd_xTe$ grown by LPE, MOCVD, and MBE is typically annealed at low temperatures in mercury vapor to adjust the intrinsic metal vacancy concentration; see, generally, H. Schaake et al, The Effect of Low Temperature Annealing on Defects, Impurities, and Electrical Properties of (Hg,Cd)Te, 3 J. Vac. Sci. Tech. A 143 (1985). The metal vacancy concentration depends upon temperature, mercury partial pressure, and composition (the x in $Hg_{1-x}Cd_xTe$), and appears to have an exponential dependence on the negative reciprocal of temperature; see. H. Vydyanath. 128 J.Electrochem.Soc. 2609 (1981).

The usual method of performing the anneal to adjust the metal vacancy concentration is to encapsulate the $Hg_{1-x}Cd_xTe$ in a quartz ampoule with excess mercury for an isothermal anneal at 50° to 300° C. of from several hours to more than sixty days depending upon the material and the desired skin thickness. However, for large area slices and epitaxial films whose width may exceed one inch, the vacuum encapsulation method is cumbersome and inefficient, and it is a problem to encapsulate large area material and remove them without expense and risk of damage upon opening the ampoule.

SUMMARY OF THE INVENTION

The present invention provides methods and apparatus for a mercury reflux anneal of $Hg_{1-x}Cd_xTe$ at low temperature. Preferred embodiment methods and apparatus include supporting $Hg_{1-x}Cd_xTe$ samples in a heated zone within the lower portion of a resealable non-isothermal annealing chamber containing a reservoir of mercury, and refluxing the mercury by condensing the mercury vapors on the unheated walls of the upper portion of the chamber. Gravity returns the condensed mercury to the hot reservoir, and a shield prevents the returning mercury from splashing onto the $Hg_{1-x}Cd_xTe$. Annealing may be done after vacuum evacuation or in the presence of a suitable inert or reducing atmosphere at a pressure of one atmosphere. Also, the combination of an LPE growth chamber and a reflux annealing chamber permits in situ annealing of an LPE film.

These methods solve the problems of the known $Hg_{1-x}Cd_xTe$ annealing methods by providing large capacity efficient annealing at low temperatures.

DESCRIPTION OF THE PREFERRED EMBODIMENTS

Figure 1:
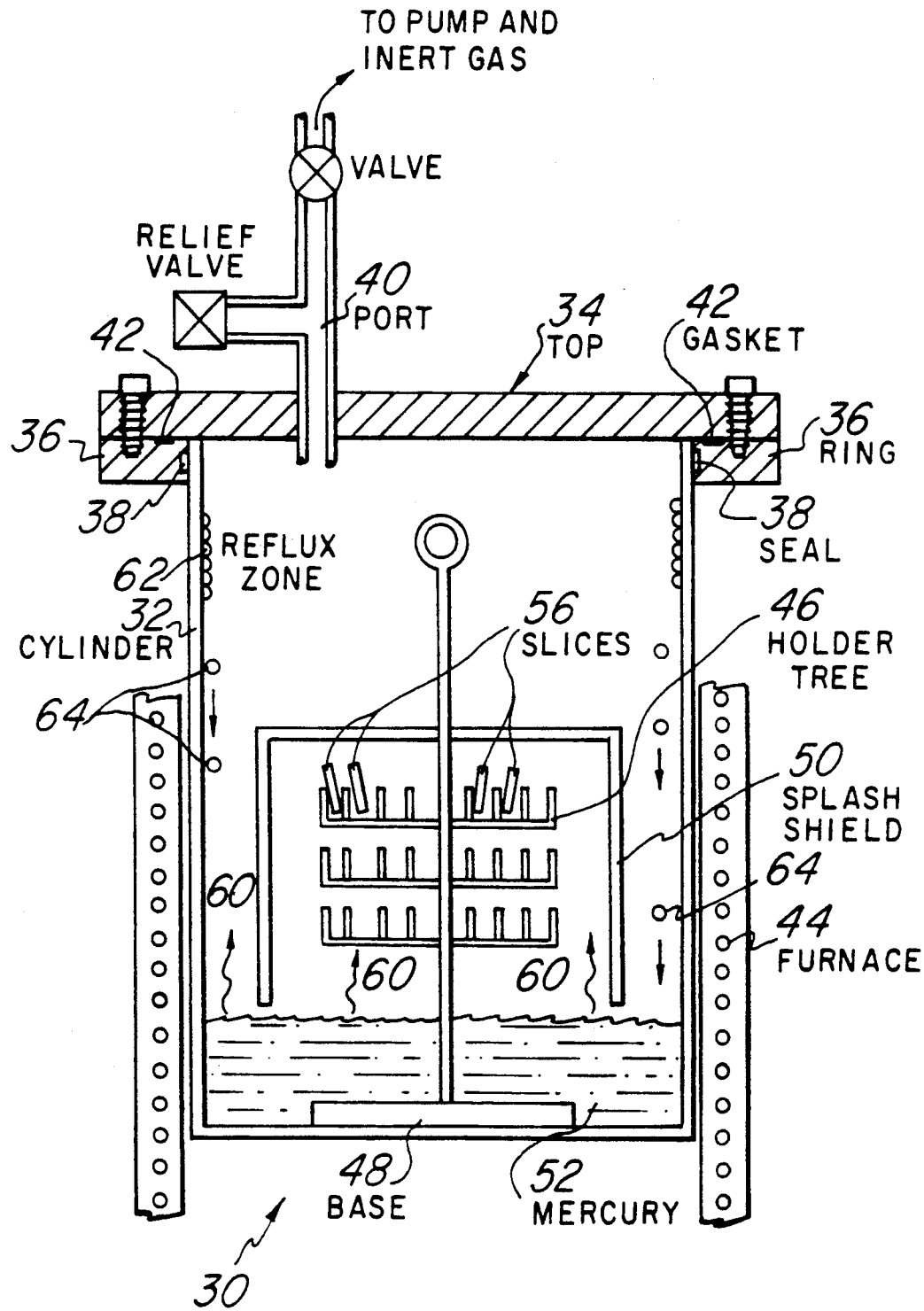
FIG. 1 is a schematic illustration of a preferred embodiment apparatus for use with preferred embodiment methods.

A first preferred embodiment method of annealing a film, slice, or ingot of $Hg_{1-x}Cd_xTe$ may be performed with a first preferred embodiment apparatus, generally denoted 30 and schematically illustrated in cross sectional elevation view in FIG. 1, which includes glass or metal cylinder 32 with a closed end, removable top 34, retaining ring 36, seal 38, top 34 including vacuum evacuation port and pressure relief valve assembly 40, furnace 44, slice holder tree 46 with base 48, splash shield 50, and mercury reservoir 52. Cylinder 32 and top 34 form a closed cylindrical chamber for the reflux annealing. Four $Hg_{1-x}Cd_xTe$ slices 56 are shown in the upper level of holder tree 46 in position for reflux annealing. Splash shield 50 may extend into mercury reservoir 52 or be held above the mercury.

Cylinder 32 is two feet long (vertical in FIG. 1), several inches in diameter, closed at the lower end, and made of one eighth inch thick material. Cylinder 32 is affixed to and supported by retaining ring 36 with seal 38 providing vacuum tightness. Retaining ring 36 is made of stainless steel and held by a support not illustrated in FIG. 1. Top 34 is bolted to ring 36 with gasket 42 providing a vacuum seal. Vacuum evacuation port 40 may be connected to a vacuum pump (not illustrated) to evacuate cylinder 32 or may be used to introduce selected gasses into cylinder 32. Furnace 44 is insulated nichrome wire wrapped around the lower three quarters of cylinder 32 (solenoid-like) and is heated in the standard manner by passing current from a power supply (not illustrated) through the wire. Note that furnace 44 only extends over the lower portion of cylinder 32, so the upper portion will not be heated and remain somewhat near room temperature during operation. Holder tree 46 may be fabricated from vitreous quartz and is dimensioned to accommodate the size of slices or ingots to be annealed. For example, if slices 20 mm by 5 mm by 0.5 mm were to be annealed, then holder tree 46 could have vertical fingers spaced about 1 mm apart. Holder tree 46 is dimensioned to hold slices 56 close to the center of furnace 44 and thus in an isothermal region. Holder tree 46 is supported by base 48 which sits on the closed end of cylinder 32: base 48 is made of quartz (and is designed not to float in mercury reservoir 52). This permits holder tree 46 and base 48 to be replaced by removing top 34 and simply lifting them out. Splash shield 50 is optional and may be made of quartz and supported by the top of holder tree 46 (as shown in FIG. 1) or by directly standing on the closed end of cylinder 32.

The operation of apparatus 30 during a first preferred embodiment annealing method includes the following steps for annealing a 20 mm by 5 mm by 0.5 mm thick slice of $Hg_{0.78}Cd_{0.22}Te$:

(a) 500 ml of pure mercury is introduced into the bottom of cylinder 32 to form reservoir 52, and holder tree 46 with slices 56 is inserted into cylinder 32. Cylinder 32 is then evacuated and back-filled with an inert gas such as helium, argon or nitrogen to a pressure of one atmosphere.

(b) Mercury reservoir 52 and slices 56 are heated to 270° C. by furnace 44: this generates a mercury vapor pressure of about 0.3 atmosphere in the region near the center of furnace 44. (Note that the pressure in cylinder is limited by relief valve in port 40.) The mercury vaporizing from reservoir 52 is suggested by the wavy arrows 60 in FIG. 1.

(c) The mercury vapors from reservoir 52 condense on the cooler upper portions of cylinder 32 as suggested by mercury condensation 62 and form drops of mercury 64 which fall back down into reservoir 52. This refluxing action continues throughout the annealing process and continuously replenishes mercury reservoir 52. At the end of this annealing, furnace 44 is turned off and cylinder 32 cooled. Top 34 can then be removed and holder tree 46 with slices 56 withdrawn. Note that refluxing the mercury from reservoir 52 as opposed to just extending furnace 44 to heat all of cylinder 32 permits use of non-metal O-rings for seal 38 and gasket 42.

Variations of the foregoing include extending the annealing time for thicker slices (the time increases roughly as the square of the thickness) and operating at different temperatures. For example, operating with the heated region at about 270° C. will require about two hours of annealing for a twenty micron thick $Hg_{1-x}Cd_xTe$ epitaxial film 56 on a CdTe substrate. Temperatures above about 300° C. lead to unacceptable metal vacancy concentrations for n-type material, but higher annealing temperatures could be employed if p-type material were desired.

Figure 2:
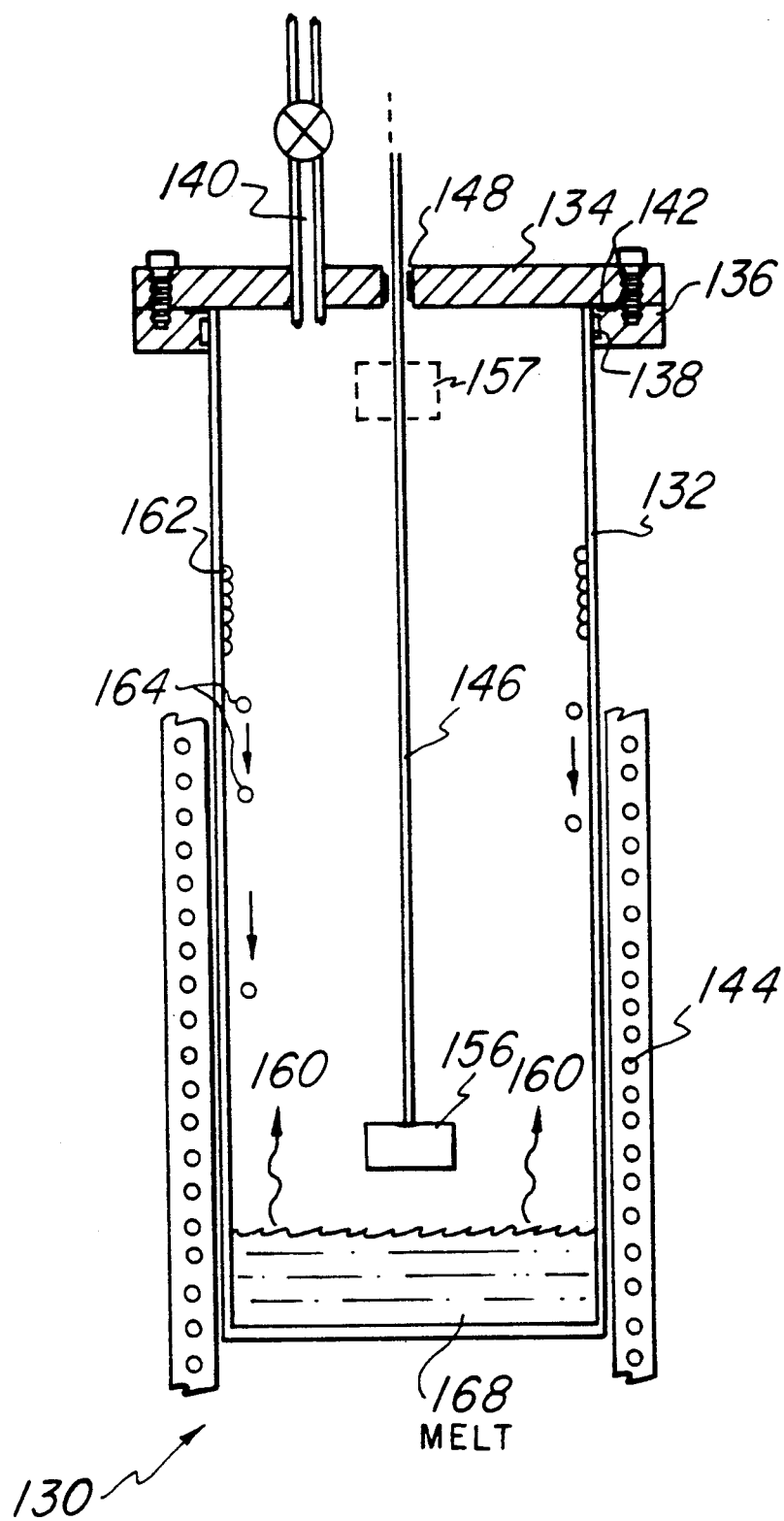
FIG. 2 is a schematic illustration of a second preferred embodiment apparatus for use with preferred embodiment methods.

A second preferred embodiment apparatus 130 for use with a second preferred embodiment method of reflux annealing is illustrated in cross sectional elevation view in FIG. 2 and includes quartz cylinder 132 with a closed end, removable top 134, retaining ring 136, seal 138, top 134 including vacuum evacuation port and relief valve assembly 140 and dipping substrate holder 146, and furnace 144. Cylinder 132 and top 134 form a closed cylindrical chamber for the reflux annealing. A thin film of $Hg_{1-x}Cd_xTe$ on CdTe substrate 156 is shown held by dipping substrate holder 146 in position for reflux annealing. Dipping substrate holder 146 may be moved vertically with seal 148 preserving the vacuum tightness. Prior to reflux annealing the $Hg_{1-x}Cd_xTe$ thin film had been grown on substrate 156 by LPE with substrate 156 immersed in $Hg_{1-x}Cd_xTe$ melt 168 contained in the bottom of cylinder 32.

Cylinder 132 is two feet long (vertical in FIG. 1), two to six inches in diameter, closed at the lower end, and made of one eighth inch thick quartz. Cylinder 132 is affixed to and supported by retaining ring 136 with seal 138 providing vacuum tightness. Retaining ring 136 is made of stainless steel and held by a support not illustrated in FIG. 2. Top 134 is bolted to ring 136 with gasket 142 providing a vacuum seal. Vacuum evacuation port 140 may be connected to a vacuum pump (not illustrated) to evacuate cylinder 132 or may be used to introduce selected gasses into cylinder 132. Furnace 144 is insulated nichrome wire wrapped around the lower portions of cylinder 32 (solenoid-like) and is heated in the standard manner by passing current from a power supply (not illustrated) through the wire. Note that the upper portion of cylinder 132 will not be heated and remain somewhat near room temperature during operation.

The operation of apparatus 130 during a second preferred embodiment LPE plus annealing method includes the following steps for growing and annealing a thin film of $Hg_{1-x}Cd_xTe$ on a 20 mm by 5 mm by 0.5 mm thick substrate of CdTe:

(a) 1,500 g of $Hg_{1-x}Cd_xTe$ melt material is introduced into the bottom of cylinder 132 to form melt 168 when heated. CdTe substrate 156 is attached to dipping substrate holder 146 which in turn is set in its uppermost position relative to top 134 (indicated by dotted outline 152 in FIG. 2), and top 134 is then bolted to retaining ring 136. Cylinder 132 is then evacuated and back-filled with a hydrogen ambient.

(b) Melt 168 is heated to 440° C. by furnace 144. Melt is a mercury rich composition of the following atomic fractions: 94.49% mercury, 0.01% cadmium, and 5.0% tellurium; this generates a mercury vapor pressure of about two atmospheres. Then substrate 156 is lowered into melt 168 for LPE growth of the $Hg_{1-x}Cd_xTe$ thin film.

(c) After growth of the thin film of $Hg_{1-x}Cd_xTe$, substrate 156 is withdrawn from melt 168 but kept within the heated region of furnace 144. Simultaneously, furnace 144 is reset to drop its heated region temperature to about 270° C. for n-type material.

(d) The mercury vapors from reservoir 152 condense on the cooler upper portions of cylinder 132 as suggested by mercury condensation 162 and form drops of mercury 164 which fall back down into reservoir 152. This refluxing action continues during the annealing of the $Hg_{1-x}Cd_xTe$ film of substrate 156, the time depending upon the film thickness. At the end of this annealing, furnace 144 is turned off and cylinder 132 is vented through port 140 to atmospheric pressure. Top 134 can then be removed and substrate 156 withdrawn. Note the advantage of immediate in situ annealing of the LPE grown $Hg_{1-x}Cd_xTe$ thin film.

MODIFICATIONS AND ADVANTAGES

Various modifications of the preferred embodiment annealing methods may be made while retaining the feature of refluxing mercury from a reservoir in a non-isothermal chamber with the slices or ingots being annealed held in an isothermal region of the chamber. For example, various size slices and ingots can be held over various size reservoirs in various shaped holder trees or dipping holders.

The temperature of the reservoir can be varied, although decreasing temperatures implies longer annealing times and increasing temperatures implies increased evaporation and condensation of mercury from the reservoir. If higher temperatures with consequent higher mercury pressures or if higher pressures by introduction of inert gasses are desired, then cylinder 32 could be made of a high temperature metal such as stainless steel. Temperatures in the range of 50° C. to 400° C. should be most useful for annealing, with 200° to 325° C. the more favorable range.

Further, the method could also be applied to thin films of $Hg_{1-x}Cd_xTe$ such as LPE or VPE films on various substrates, as well as other compound semiconductors. Indeed, the second preferred embodiment method of annealing by suspension over a mercury-rich melt immediately after LPE growth of a film in the melt could be modified to have a tellurium-rich melt plus a separate mercury reservoir adjacent so that LPE growth in the tellurium-rich melt would be immediately followed by suspension over the mercury reservoir for the annealing. In this arrangement the mercury reservoir could have a separate furnace or heating zone.

Such annealed substrates with doped films and doped bulk $Hg_{1-x}Cd_xTe$ can be incorporated into various infrared detectors and arrays to provide the photosensitive semiconductor.

The advantages of annealing by using refluxing mercury include the ability to accomodate multiple pieces of large area $Hg_{1-x}Cd_xTe$ materials without the necessity of quartz encapsulation, thereby eliminating quartz consumption and possible material damage from opening an ampoule while providing ease and convenience.

What is claimed is:

1. A method of annealing a semiconductor sample, comprising the steps of:
   (a) providing a closed chamber having upper and lower portions and a reservoir in the lower portion, said reservoir filled with a liquid;
   (b) positioning a semiconductor sample in said lower portion of said chamber and above said liquid;
   (c) providing a splash shield over said sample totally within said lower portion of said chamber to prevent liquid condensing in said upper portion of said chamber from striking said sample while travelling from said upper portion of said chamber to said lower portion of said chamber;
   (d) heating said lower portion of said chamber including said splash shield and said liquid to a temperature sufficiently high to vaporize said liquid in said reservoir and to cause said vaporized liquid to rise into said upper portion of said chamber, while maintaining said upper portion of said chamber at a temperature sufficiently low to cause condensation of the liquid vapors therein and return of said condensed liquids to said reservoir;
   (e) heating said sample while positioned in said lower portion of said chamber to substantially the same temperature as said liquid; and
   (f) maintaining said sample positioned in said lower portion of said chamber at said temperature of said liquid to anneal said sample while maintaining the temperature in said upper portion of said chamber sufficiently low to cause condensation of the liquid vapors therein.

2. The method of claim 1 wherein said liquid is mercury and said sample is a group II-VI compound.

3. The method of claim 2 wherein said compound is HgCdTe.

4. The method of claim 1 further including providing a holder tree within said shield supporting said sample.

5. The method of claim 3 wherein said reservoir and said sample are both heated to a temperature in the range of from about 50° C. to about 400° C.

6. The method of claim 5 wherein said reservoir and said sample are heated to a temperature in the range of 200° C. to 325° C.

7. A method of coating and annealing a substrate, comprising the steps of:
   (a) providing a closed growth chamber having a lower portion and an upper portion and a reservoir in said lower portion of said chamber filled with a liquid capable of forming a liquid phase epitaxially grown film thereof on a substrate;
   (b) providing a substrate disposed within said closed chamber;
   (c) positioning said substrate in said liquid to form a liquid phase epitaxially grown film of said liquid on said substrate;
   (d) withdrawing said substrate with said film thereon from said reservoir while retaining said substrate and film in said lower portion of said chamber;
   (e) then adjusting the temperature of said lower portion of said chamber to the annealing temperature of said film;
   (f) providing a source of vapor in said lower portion of said chamber and a region for condensation of said vapor for refluxing said vapor in said upper portion of said chamber; and
   (g) holding said substrate and film in said refluxing vapors in said lower portion of said chamber until annealed.

8. The method of claim 7 wherein said film is a group II-VI compound.

9. The method of claim 8 wherein said compound is HgCdTe.

10. The method of claim 7 wherein said vapor is provided by said liquid.

11. The method of claim 8 wherein said vapor is provided by said liquid and is Hg.

12. The method of claim 9 wherein said vapor is provided by said liquid and is Hg.

13. The method of claim 12 wherein said substrate and film are heated to a temperature in the range of from about 50° C. to about 400° C.

14. The method of claim 13 wherein said substrate and film are heated to a temperature in the range of from 200° C. to 325° C.

15. The method of claim 13 wherein said refluxing is provided by heating the lower portion of said chamber to a temperature sufficiently high to vaporize at least said Hg and by maintaining the temperature of said upper portion sufficiently low to cause condensation of the vapor therein.

* * * * *